United States Patent [19]

Nishimura

[11] Patent Number: 4,514,895
[45] Date of Patent: May 7, 1985

[54] METHOD OF FORMING FIELD-EFFECT TRANSISTORS USING SELECTIVELY BEAM-CRYSTALLIZED POLYSILICON CHANNEL REGIONS

[75] Inventor: Tadashi Nishimura, Itami, Japan

[73] Assignee: Mitsubishi Denki Kabushiki Kaisha, Tokyo, Japan

[21] Appl. No.: 586,861

[22] Filed: Mar. 6, 1984

[30] Foreign Application Priority Data

Apr. 20, 1983 [JP] Japan .................................. 58-71609

[51] Int. Cl.³ .................. H01L 21/265; H01L 21/306; H01L 21/268
[52] U.S. Cl. .................................. 29/571; 29/576 B; 29/576 T; 148/187; 357/91
[58] Field of Search .................. 148/1.5, 187; 29/571, 29/576 B, 576 T; 357/91

[56] References Cited

U.S. PATENT DOCUMENTS

| | | | |
|---|---|---|---|
| 4,187,126 | 2/1980 | Radd et al. | 148/1.5 |
| 4,292,091 | 9/1981 | Togei | 148/1.5 |
| 4,319,954 | 3/1982 | White et al. | 148/1.5 |
| 4,381,202 | 4/1983 | Mori et al. | 148/1.5 |
| 4,383,883 | 5/1983 | Mizutani | 156/603 |
| 4,395,433 | 7/1983 | Nagakubo et al. | 148/1.5 |
| 4,415,383 | 11/1983 | Naem et al. | 148/187 |
| 4,448,632 | 5/1984 | Akasaka | 148/1.5 |

FOREIGN PATENT DOCUMENTS 0071471 2/1983 European Pat. Off. .......... 29/576 T

OTHER PUBLICATIONS

Biegelsen et al., Appl. Phys. Letts. 38 (1981) 150.
Lasky, J. Appl. Phys. 53 (1982) 9038.
Fowler et al., IBM-TDB, 22 (1980) 5473.
Nishimura et al., Appl. Phys. Letts. 42 (1983) 102.
Fowler et al., IBM-TDB, 24 (1981) 1090.

Primary Examiner—Upendra Roy
Attorney, Agent, or Firm—Lowe King Price & Becker

[57] ABSTRACT

A method of manufacturing MOS field-effect transistors using a wafer (40) having a polycrystal or amorphous semiconductor layer formed on an insulator comprises a step in which an energy beam (44) is applied to the semiconductor layer by scanning the beam intermittently and correlatively to the wafer so as to heat locally the semiconductor layer whereby only a plurality of portions (41) contained in the semiconductor layer and assigned for forming channel regions of MOS field-effect transistors are monocrystallized or the crystalline grains in the above described positions are made large. According to the present invention, a strain occurring in a recrystallized semiconductor can be mitigated by the selective heating.

11 Claims, 19 Drawing Figures

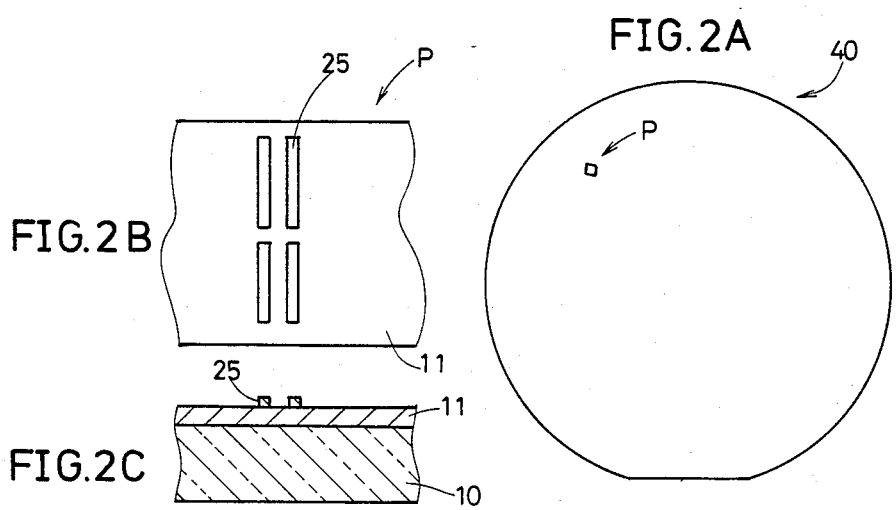
FIG. 2A
FIG. 2B
FIG. 2C
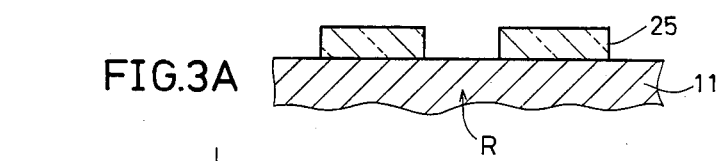
FIG. 3A
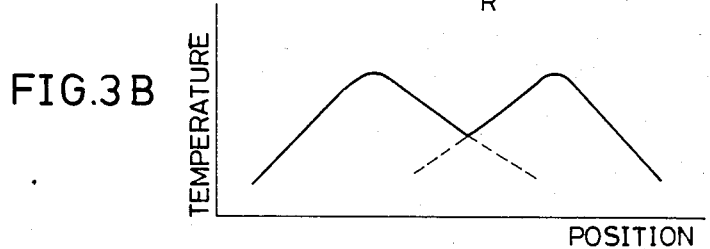
FIG. 3B
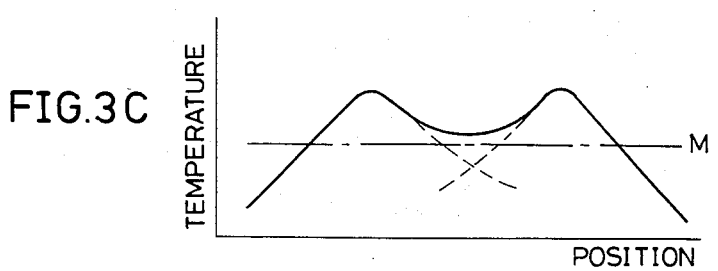
FIG. 3C

METHOD OF FORMING FIELD-EFFECT TRANSISTORS USING SELECTIVELY BEAM-CRYSTALLIZED POLYSILICON CHANNEL REGIONS

BACKGROUND OF THE INVENTION

1. Field of the Invention

The present invention relates to a method of manufacturing MOS field-effect transistors and particularly to a method of forming MOS field-effect transistors using a substrate where a semiconductor single crystal film is formed on an insulator.

2. Description of the Prior Art

In order to realize high speed operation and high density integration of a semiconductor device, efforts have been made to manufacture a semiconductor integrated circuit device of a small stray capacity by separating circuit elements by dielectric material. In one method, for example, a polycrystal or amorphous semiconductor film is deposited on an insulator and an energy beam, such as a laser beam, an electron beam or the like, is applied to the surface of the semiconductor film so as to heat only the surface layer, whereby a single crystal semiconductor film is formed and MOS filed-effect transistors (MOS FETs) subsequently are formed thereon. In such a manner, an element of an extremely small stray capacity having the circumference and the lower portion separated from other circuit elements by a dielectric material can be obtained.

FIGS. 1A to 1I are sectional views showing states in the major steps of manufacturing a MOS field-effect transistor according to such a conventional method. First, as shown in FIG. 1A, a polysilicon layer 11 of a thickness of 5000 Å, for example, is deposited on a silicon dioxide ($SiO_2$) substrate 10 by an ordinary low pressure chemical vapor deposition (CVD) method. The polysilicon layer 11 is then exposed to an oxidizing atmosphere at a temperature of 950° C., for example, so as to form an oxide film 12 of a thickness of 500 Å for example, on which a nitride film 13 of a thickness of 1000 Å, for example, is deposited by the low pressure chemical vapor deposition method, as shown in FIG. 1B. Then, as shown in FIG. 1C, the nitride film 13 is patterned by a photographic process. Subsequently, the films are exposed to an oxidizing atmosphere, at a temperature of 950° C. for example, for a long period of time so that all the portions without the pattern of the nitride film 13 are oxidized. After that, the nitride film 13 and the oxide film 12 existing under the nitride film 13 are removed and then, as shown in FIG. 1D, a form in which the circumference and the lower portion of the polysilicon layer 11 are surrounded by the insulating silicon dioxide materials 10 and 14 can be obtained. However, in this state, the polysilicon layer 11 does not have a crystallizing property for forming an element and accordingly, by applying a narrowly focused energy beam such as laser beam or electron beam and the like, the polysilicon is melted to be recrystallized so that polysilicon of single crystal or of a large grain diameter is obtained. FIG. 1E shows this step where the reference numeral 15 denotes the recrystallized silicon layer. Subsequently, according to an ordinary process of manufacturing a MOS field-effect transistor, a gate oxide film 16 is formed on the recrystallized silicon layer 15 as shown in FIG. 1F and then, as shown in FIG. 1G, polysilicon is deposited on the gate oxide film 16 to undergo a desired patterning so that a polysilicon gate electrode 17 is formed. Subsequently, as shown in FIG. 1H, using the polysilicon gate electrode 17 as a mask, a large amount of impurity is introduced in the recrystallized silicon layer 15 so that a source region 18 and a drain region 19 are formed. After that, as shown in FIG. 1I, an oxide film 20 is formed on the whole surface and contact holes are provided in the portions above the gate electrode 17, the source region 18 and the drain region 19 so that a gate wiring 21, a source wiring 22 and a drain wiring 23 are provided, and then a surface protective film 24 is formed on the whole surface. Thus, the manufacture of the MOS field-effect transistor is completed.

In a conventional manufacturing method, all the regions assigned for forming MOS field-effect transistors are melted and recrystallized by application of a laser beam and the like. In another conventional method, the whole surface of a polycrystal silicon layer formed on a wafer is melted and recrystallized in advance so that elements are formed thereon. However, in such conventional methods, a large strain occurs in the recrystallized silicon layer from various causes such as local solidification and expansion due to the melting and recrystallization or a difference of the thermal expansion coefficients of the silicon and the insulating substrate. In addition, it is extremely difficult to remove such a strain in an ordinary process. Such a strain causes unfavorable influences in the electric characteristics such as irregularities in the carrier mobility, leakage of minor current in the pn junction, etc., also causes warping of the whole wafer, which hinders a fine patterning.

SUMMARY OF THE INVENTION

Therefore, a principal object of the present invention is to provide a method of manufacturing MOS field-effect transistors in which a strain occurring in the recrystallized semiconductor can be mitigated.

Briefly stated, the present invention comprises a method of manufacturing MOS field-effect transistors using a wafer having a polycrystal or amorphous semiconductor layer formed on an insulator, the above described method comprising a step in which an energy beam is applied to the semiconductor layer by scanning the beam intermittently and correlatively to the wafer so as to heat locally the semiconductor layer whereby only a plurality of portions contained in the semiconductor layer and assigned for forming channel regions of MOS field-effect transistors are monocrystallized or the crystalline grains in the above described portions are made large.

According to the present invention, only the portions in the semiconductor layer, assigned for forming channel regions of MOS field-effect transistors are selectively heated by an energy beam.

A principal advantage of the present invention is that a strain occurring in the recrystallized semiconductor layer can be mitigated.

Another advantage of the present invention is that warping of a wafer due to a strain can be suppressed, which enables a fine patterning to be easily made.

Another advantage of the present invention is that MOS field-effect transistors having excellent and uniform electric characteristics can be manufactured.

A further advantage of the present invention is that the processing time required for recrystallization can be notably shortened.

BRIEF DESCRIPTION OF THE DRAWINGS

FIG. 2A is a plan view of a wafer wherein a silicon nitride layer on a polysilicon layer on the surface of an insulating substrate is patterned in accordance with an embodiment of the present invention.

FIG. 2B is a partial enlarged plan view of a portion P of the wafer shown in FIG. 2A.

FIG. 2C is a partial enlarged sectional view of a portion P of the wafer shown in FIG. 2B.

FIG. 3A is a partial enlarged sectional view of the wafer shown in FIG. 2C.

FIGS. 3B and 3C are graphs showing temperature rise distributions in the wafer as it is scanned by laser beams having different energy levels, respectively.

DESCRIPTION OF THE PREFERRED EMBODIMENTS

Figure 1A:
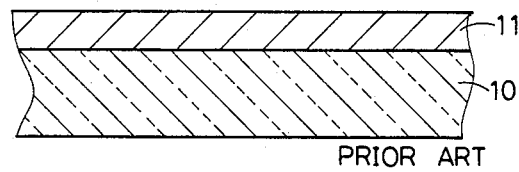
FIGS. 1A to 1I are sectional views showing states in the major steps of manufacturing a MOS field-effect transistor in accordance with a conventional method.
Figure 1B:
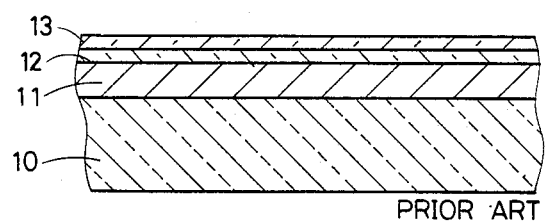

FIG. 2A is a plan view of a wafer wherein a silicon nitride layer on a polysilicon layer on the surface of a silicon dioxide substrate is patterned in accordance with an embodiment of the present invention. FIG. 2B is a partial enlarged plan view of a portion P of the wafer shown in FIG. 2A. FIG. 2C is a partial enlarged sectional view of a portion P of the wafer shown in FIG. 2B. On a wafer 40 where a polysilicon layer 11, of a thickness of 5000 Å for example, is deposited on a silicon substrate 10 by a low pressure chemical vapor deposition method for example, a silicon nitride film 25 of a thickness of 1500 Å for example, is further deposited, by a low pressure chemical vapor deposition method for example, so that the film 25 is patterned in the form of two stripes using a photographic process and a dry etching method well known in the art. The regions subjected to the patterning are regions for forming a channel region in the subsequent steps. The channel region mentioned herein comprises a channel and a junction region structured by the channel, a source and a drain. FIG. 3A, 3B and 3C respectively, are a view and graphs for explaining a state in which temperature rises in the wafer 40 in such situation when a laser beam is applied. As shown in a partial enlarged sectional view in FIG. 3A, when a laser beam is applied to the wafer 40, the silicon nitride film 25 acts as a non-reflecting film and the distribution of temperature in the wafer becomes as shown in FIG. 3B. In consequence, the polysilicon layer 11 in the regions having the silicon nitride film 25 can be melted and recrystallized by low power which could not melt the polysilicon layer 11 in other regions. At this time, if the power of the laser beam is slightly increased, a region R without the silicon nitride film 25 interposed between the high temperature regions can be also melted at a temperature exceeding the melting temperature M of silicon, as shown in FIG. 3C. In addition, since this region R has a temperature lower than that in the adjacent portions, nucleation begins from this region to develop crystallization to both sides and as a result, this region can be made a region having nearly no grain boundary. Needless to say, the power of the laser beam at this time does not attain a value for melting the polysilicon layer 11 in the peripheral regions without the silicon nitride film 25. The width of a stripe of the silicon nitride film 25 is preferably approximately 10 μm and the distance between the two stripes is also preferably approximately 10 μm, while there is no limitation in the length of a stripe. Since the channel length of a MOS field-effect transistor to be used in a high density integrated circuit is less than 10 μm in most cases, such size does not cause any inconvenience in manufacturing a MOS field-effect transistor. A spot diameter of the laser beam, that is, a width in which the polysilicon is melted is variable in the range from 25 to 50 μm and therefore a desired region can be recrystallized by one scanning operation of the laser beam while the other regions can be left in the state not melted. The scanning direction of the laser beam is preferably a direction substantially orthogonal with the channel direction. The first reason thereof is that scanning of the laser beam is made more efficiently in the transversal direction of a channel, that is, in the direction orthogonal with the longitudinal direction of a channel, since the channel width is larger than the channel length in any type of MOS field-effect transistor. The second reason thereof is that by selecting a scanning direction as described above, occurrence of a grain boundary connecting a source and a drain can be prevented.

Figure 1C:
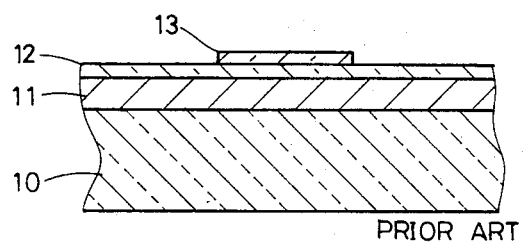
Figure 1D:
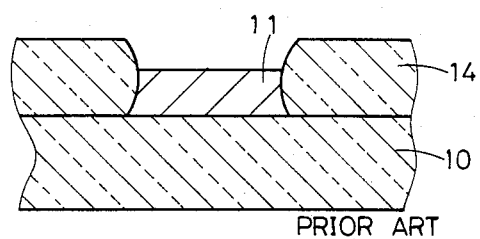
Figure 1E:
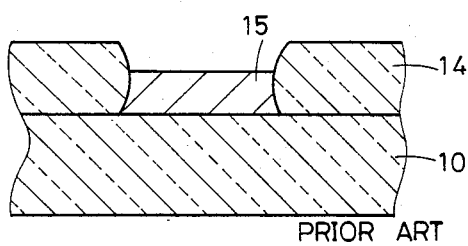
Figure 1F:
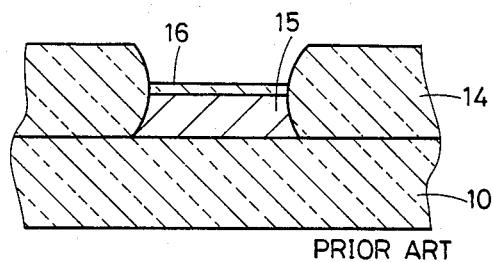
Figure 1G:
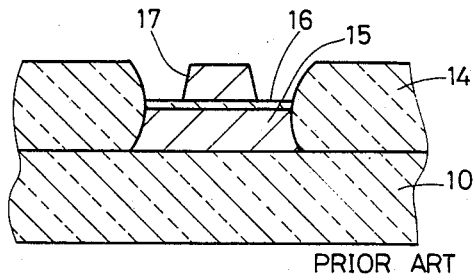
Figure 1H:
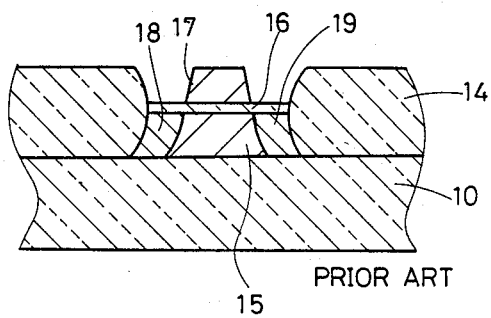
Figure 1I:
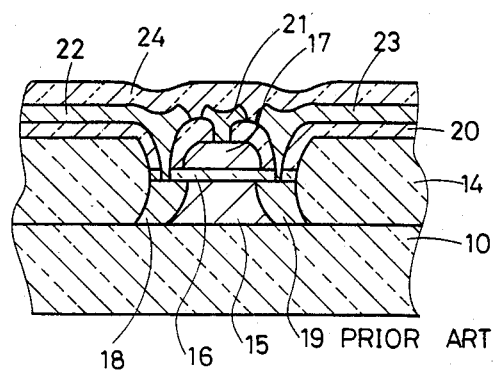
Figure 4A:
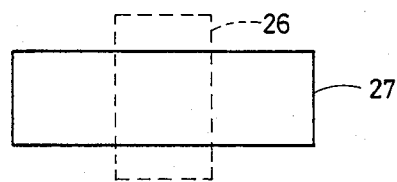
FIGS. 4A and 4B are plan views showing states in a certain step of a process of manufacturing a MOS field-effect transistor after a portion of a polysilicon layer is monocrystallized in accordance with an embodiment of the present invention.
Figure 4B:
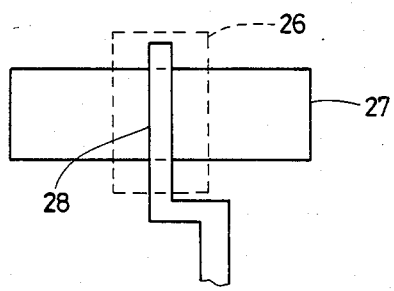

The subsequent steps after the above described step are the same as those in an ordinary method of manufacturing a MOS field-effect transistor. More specifically, after the above described recrystallization by application of the laser beam, the wafer from which the silicon nitride film 25 is removed in the above described manner is exposed to an oxidizing atmosphere at a temperature of 950° C. for example, so as to form a silicon oxide film of a thickness of 500 Å for example, and after that a silicon nitride film of a thickness of 1000 Å for example is formed, by using a low pressure chemical vapor deposition method for example. In this case, the oxidation speed in the recrystallized region is lower than that in other regions and as a result a portion 26 having a level difference is formed in the surface of the wafer. Consequently, utilizing this portion 26 having a level difference, operation by a photographic process can be performed by fitting a mask for a field pattern 27. Thus, the same patterning as in FIG. 1C is made and subsequently, by the selective oxidation, a MOS field-effect transistor region has a form surrounded by a field oxide film 14, as shown in FIG. 1D. After that, the silicon nitride film and the silicon oxide film on the surfaces of the islands of silicon are removed so that a gate oxide film is further formed in an oxidizing atmosphere at a temperature of 1000° C. for example. Then, a gate electrode 28 is provided in the recrystallized region in the center, as shown in FIG. 4B, and subsequently, according to an ordinary method of manufacturing a MOS field-effect transistor, manufacture of a MOS field-effect transistor is completed.

Figure 6:
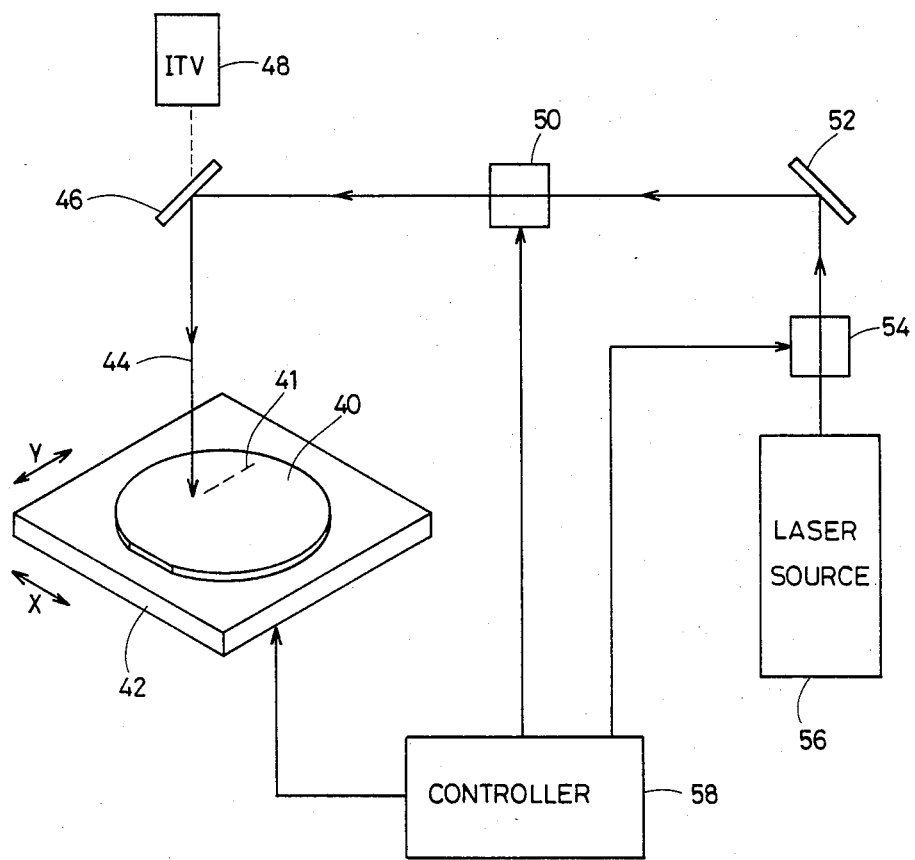
FIG. 6 is a schematic view showing an example of a manufacturing apparatus in accordance with the present invention.

Although in the above described embodiment, a silicon nitride film 25 is formed and patterned in advance on the polysilicon layer 11 prior to the recrystallization by the laser beam, the laser beam may be applied directly to the polysilicon layer 11 so as to recrystallize only the necessary region, that is, the above described drain region, dependently on the characteristics of a MOS field-effect transistor required. More specifically, if the position and the scanning length of a desired region are stored as data in a computer so that the laser beam is applied only to the necessary portions of a wafer by the control of the computer, the recrystallizing process can be made considerably more efficient. An apparatus for applying the above described method will be briefly described with reference to the drawings. FIG. 6 is a schematic view showing an example of a manufacturing apparatus in accordance with the present invention. A wafer 40 is provided on an X-Y stage 42. A laser beam 44 provided from a laser source 56 is reflected by mirrors 52 and 46 to be applied to the wafer 40. The X-Y stage 42 is moved in the X axis direction and in the Y axis direction by the control of a controller 58 including a computer. In the course of the laser beam 44, a modulator 54 is provided. The modulator 54 intermits the laser beam 44 by the control of the controller 58. Also in the course of the laser beam 44, a power attenuator 50 is provided so as to regulate the power of the laser beam 44 by the control of the controller 58. By using such apparatus as described above, the laser beam 44 is scanned intermittently and correlatively with respect to the wafer 40, whereby only a plurality of portions 41 assigned to the channel regions of MOS field-effect transistors are monocrystallized. An ITV monitor 48 monitors the state where the laser beam 44 is applied as described above.

Figure 5:
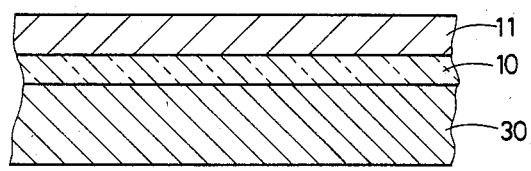
FIG. 5 is a sectional view of a wafer in which a thin silicon dioxide film is formed on a silicon substrate.

Since boundaries between the regions recrystallized in the above described manner and the regions not recrystallized become source regions and drain regions where impurity of high concentration is doped, it was ascertained by experiments that such boundaries exert little influence on the electric characteristics of MOS field-effect transistors. In addition, although a laser beam was used for recrystallization in the above described embodiment, other local heating means such as an electron beam or a converged light of a halogen lamp, or arc lamp etc., may be used. Instead of the above described silicon dioxide substrate 10, a structure in which a silicon dioxide film 10 is formed on a silicon substrate 30 for example, as shown in FIG. 5, may be adopted.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method of manufacturing MOS field effect transistor using a wafer having a polycrystal or amorphous semiconductor layer formed on an insulator, comprising the steps of: depositing a polysilicon layer on a silicon substrate; depositing on said polysilicon layer at least two non-reflective stripes forming a channel therebetween; scanning said polysilicon layer and said non-reflective stripes with an energy beam having a diameter and intensity adequate to melt said polysilicon only in regions beneath and between non-reflective stripes and controlling said beam to be intermittent to impinge only preselected regions of said polysilicon layer assigned to be channel regions.

2. A method in accordance with claim 1, wherein said scanning step includes scanning said preselected regions of polysilicon beneath and between non-reflective stripes to generate a temperature distribution thereat whose maximum value at all points exceeds the melting point of said polysilicon and in which the highest temperatures are attained beneath said non-reflective stripes.

3. A method in accordance with claim 2, wherein each of said channel regions comprises a channel and a junction region structured by said channel, a source and a drain.

4. A method in accordance with claim 2, wherein said scanning step includes storing position and scanning length data in the memory of a computer and applying signals therefrom to control a beam source.

5. A method in accordance with claim 2, wherein said scanning step includes forming a prepatterned film on said semiconductor layer.

6. A method in accordance with claim 2, wherein said energy beam is a laser beam.

7. A method in accordance with claim 2, wherein said energy beam is an electron beam.

8. A method in accordance with claim 2, wherein said energy beam is a converged light beam.

9. A method in accordance with claim 2, wherein said insulator is formed on a semiconductor substrate.

10. A method in accordance with claim 3, wherein said scanning step includes scanning in a direction substantially orthogonal with the direction of said channel.

11. A method in accordance with claim 5, wherein said film is a silicon nitride film.

* * * * *